(12) United States Patent
Thompson, Sr.

(10) Patent No.: US 6,610,430 B1
(45) Date of Patent: Aug. 26, 2003

(54) METHOD OF ATTACHING A DEVICE TO A CIRCUIT BOARD

(75) Inventor: Curtis C. Thompson, Sr., Meridian, ID (US)

(73) Assignee: Plexus Services Corp., Neenah, WI (US)

( * ) Notice: Subject to any disclaimer, the term of this patent is extended or adjusted under 35 U.S.C. 154(b) by 545 days.

(21) Appl. No.: 08/896,412

(22) Filed: Jul. 18, 1997

(51) Int. Cl.⁷ .................................................. B32B 9/04
(52) U.S. Cl. ........................ 428/901; 428/209; 439/74; 361/779; 256/712; 256/713; 256/720; 256/727; 228/180.21; 228/191; 228/248.1; 228/254
(58) Field of Search ............................. 228/254, 248.1, 228/49.5, 44.7, 33, 191, 180.21, 180.22, 180.1, 218, 262.51, 262.42, 179.1; 428/209, 901; 439/75, 71, 74; 361/779; 257/720, 713, 727, 712

(56) References Cited

U.S. PATENT DOCUMENTS

| | | | |
|---|---|---|---|
| 5,468,999 A | | 11/1995 | Lin et al. |
| 5,551,627 A | * | 9/1996 | Leicht et al. .......... 228/180.22 |
| 5,691,041 A | * | 11/1997 | Frankeny et al. ........... 428/209 |
| 5,796,590 A | * | 8/1998 | Klein .......................... 361/774 |
| 5,838,069 A | | 11/1998 | Itai et al. |
| 5,844,316 A | | 12/1998 | Mallik et al. |
| 5,859,474 A | | 1/1999 | Dordi |
| 5,861,678 A | | 1/1999 | Schrock |
| 5,869,904 A | | 2/1999 | Shoji |
| 5,883,438 A | | 3/1999 | Kang |
| 5,892,288 A | | 4/1999 | Muraki et al. |
| 5,921,462 A | * | 7/1999 | Gordon ....................... 228/191 |
| 5,930,889 A | * | 8/1999 | Klein ........................... 29/840 |

OTHER PUBLICATIONS

U.S. patent application Ser. No. 08/897,093, Curtis C. Thompson, Sr., filed Jul. 18, 1997.
Beck, M., et al. (1996) BGA assembly and solder paste verification. Electronic Packaging and Production 76–78.
Bolton, S., et al. (1994) Influence of plastic ball grid array design/materials upon solder joint reliability IEPS Conference 725–739.
Herbst, M., et al. (1994) Stencil options. SMT 51–52.
Holzmann, M., et al. Solid solder deposits (SSD): an enabling technology for fine pitch assembly.
O'Hara, W.B., et al. (1995) Voiding in BGAs. Soldering & Surface Mount Technology 21:44–48.
O'Hara, W.B., et al. (1996) Voiding mechanism in BGA assembly. The International Journal of Microcircuits and Electronic Packaging. 19(3):190–198.

* cited by examiner

Primary Examiner—Merrick Dixon
(74) Attorney, Agent, or Firm—Perkins Coie LLP

(57) ABSTRACT

A method of soldering a ball grid array device onto a circuit board which includes: positioning a solder paste brick on top of a contact pad of the circuit board, said solder past brick defining an irregularly shaped structure such that a majority of a top surface of the solder paste brick is not in contact with the solder ball terminal, wherein volatized flux gases formed during heating escape via the top surface without migrating upwardly into the solder ball terminal; attaching the ball grid array device onto the circuit board such that a solder ball terminal of the ball grid array device makes contact with a portion of an edge of the solder paste brick while remaining substantially aligned with a center of the pad; and heating the ball grid array device and the circuit board so as to melt the solder ball terminal and the solder paste brick, thereby forming a solder joint between the ball grid array device and the circuit board.

7 Claims, 9 Drawing Sheets

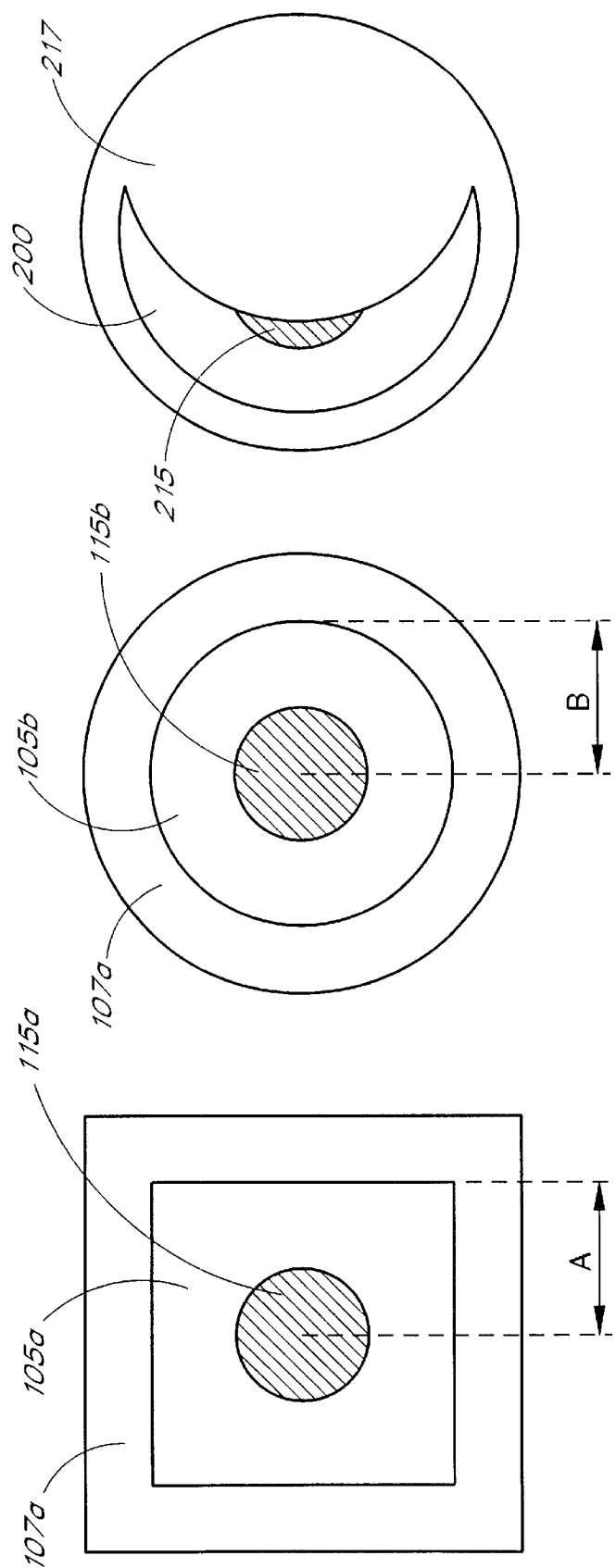

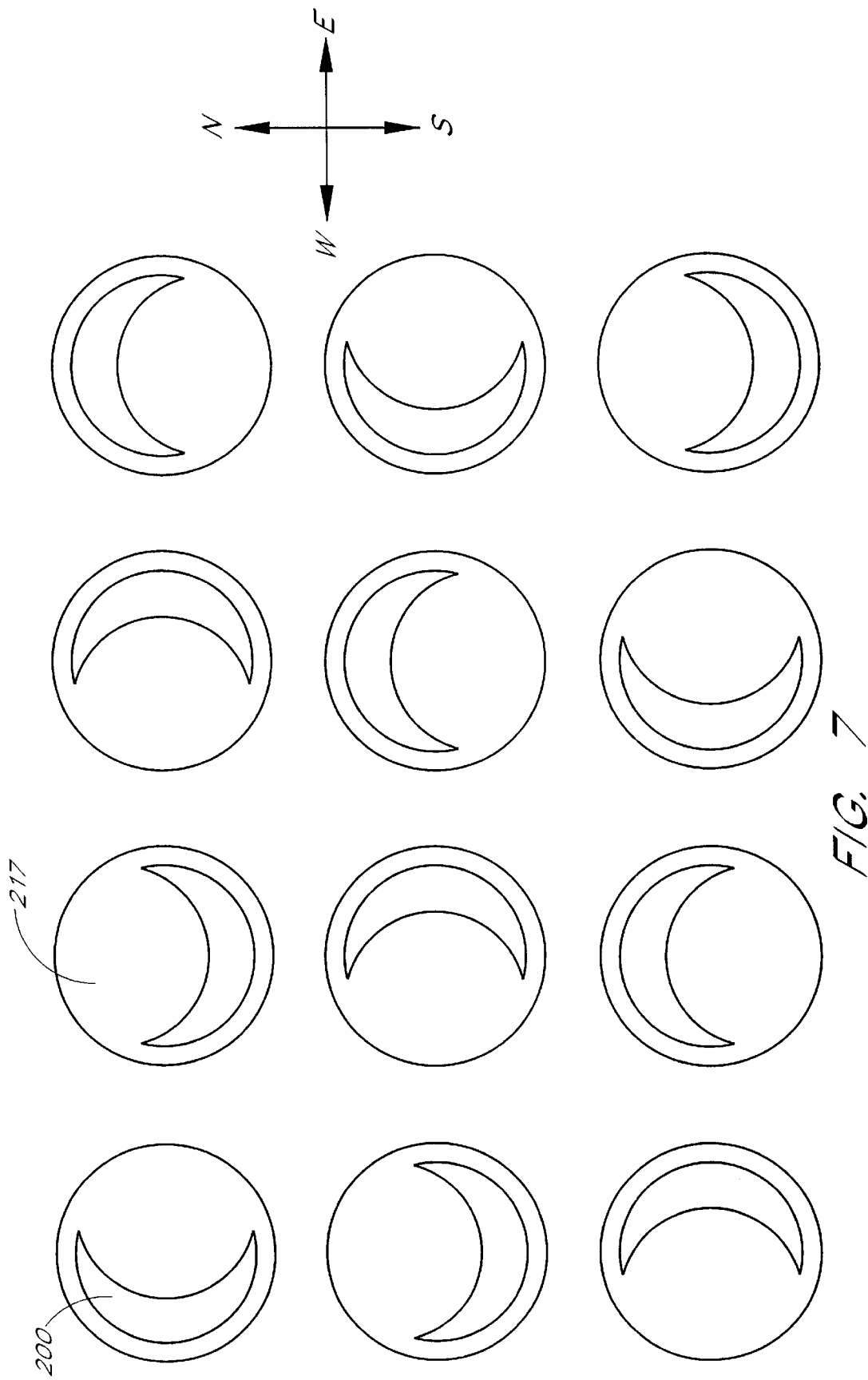

METHOD OF ATTACHING A DEVICE TO A CIRCUIT BOARD

BACKGROUND OF THE INVENTION

1. Field of the Invention

The present invention is related to the field of integrated circuits and surface mount technology (SMT). More specifically, the present invention is directed to an improved solder brick design for reducing voiding caused by volatized flux gases trapped within solder joints formed between ball grid array (BGA) integrated circuit (IC) devices and printed circuit boards (PCBs), chip carriers, or other similar components, during reflow soldering processes.

2. Description of Related Technology

Surface mount technology (SMT) is increasingly being employed as a cost-effective means of mounting IC devices to printed circuit boards. Numerous different techniques for mounting integrated circuit devices to circuit boards, chip carriers, or other components fall within the general category of SMT. Of these techniques, area array (as opposed to perimeter array) technology is often used to mount high I/O density packages with a great degree of reliability and manufacturing efficiency. Area array techniques include the use of pin grid arrays (PGAs), column grid arrays (CGAs), and ball grid arrays (BGAs). The more recent BGA and CGA techniques provide substantial improvements over PGA methods in that higher densities, reliability, and efficiency can be obtained for many types of packages.

Common BGA package configurations include ceramic (CBGA) and plastic (PBGA), as well as micro-BGA (MBGA). Each of these types of packages has its own attributes, which are also well understood in the field of SMT. Package outline specifications are presented in industry standards such as the joint industry council (JEDEC) publication 1995. In addition to individual IC devices, multi-chip modules or chip carriers can also be effectively surface mounted using area array techniques.

As the name implies, ball grid arrays (BGAs) utilize a grid or array of electrical terminals, such as solder bumps or balls arranged on one side of the IC package to effectuate electrical contact with the circuit board. The solder bumps of the array may vary in material, size (height and width) and pitch (i.e., bump-to-bump spacing) based on the individual package. Standard bump heights may range from less than one to several millimeters. Standard pitches in common use are 1.00, 1.27, and 1.50 mm (PBGA) and (CBGA) and 0.5 mm (MBGA). Additionally, the solder bumps may be arranged in a uniform or non-uniform array pattern, with some leads removed in certain areas, which is referred to as "depopulation," depending on the desired attributes of the package.

Solder bumps or balls are typically attached to the pads of a PCB using a eutectic solder paste which holds the BGA device onto the PCB during the reflow process. The solder paste typically consists of a thick viscous fluid-like substance, called flux, which is mixed with tiny solder particles, or "spheres", to form the paste. Solder paste "bricks" are formed from the eutectic solder paste and positioned within the perimeter of each pad in order to make contact with the solder ball terminals of the BGA device. The flux, within each solder paste brick has a consistency and "tackiness" similar to that of honey and sticks to the solder ball terminals with which it comes into contact.

After the BGA device is attached to the PCB as described above, the BGA device is mounted to the PCB using reflow solder processing techniques. Reflow solder processes generally use forced convection heating (air or nitrogen) to melt and reflow solder balls and/or paste interposed between the surfaces to be joined. The BGA device and PCB assembly is then exposed to a temperature profile which results in reflow of the solder. Surface tension created in the resulting solder liquid mass during reflow tends to prevent collapse of the solder, causing the joint to eventually solidify in a barrel or truncated sphere shape that is commonly referred to as a Controlled Collapse Chip Connection, or "C-4". Numerous variations on this general theme exist, including the use of two more different solders with various melting points to produce reflow of various portions of the joint during different processes, or to allow rework.

Attachment of a PBGA device, for example, onto a PCB is typically accomplished by using solder paste bricks which are formed by screen printing eutectic solder paste onto an array of solder pads on the PCB. A typical method of screen printing includes the step of placing a solder paste stencil, having apertures that are of the same shape as the desired solder paste bricks, onto a PCB such that the apertures are aligned with the pads of the PCB. Solder paste is then applied to the unmasked areas, and the stencil is subsequently removed. The PBGA device is then placed on the PCB such that the solder ball leads contact the solder paste bricks on the etched pads. The entire assembly is then passed through a reflow process which applies a predetermined time/temperature profile to the solder paste bricks to liquify the solder paste bricks and the solder balls of the PBGA device, thereby forming solder joints between the BGA device and the pads of the PCB. The fully reflowing solder joints, coupled with the relatively large solder joint pitch (compared to leaded devices) allow the package to self-align during reflow through the equalization of surface tension forces, as described above. The self-alignment feature of the PBGA is largely responsible for the high assembly yields observed with this package in production.

FIG. 1 depicts a typical prior art surface mount of a BGA IC device 101 having solder ball terminals 103 aligned on top of solder paste bricks 105 which are positioned on top of contact pads 107 of a printed circuit board 109. FIG. 2 is a side view taken along lines 2—2 of FIG. 1, of the BGA IC device 101 positioned on top of the PCB 109 such that the solder ball terminals 103 are aligned on top of corresponding solder paste bricks 105, which are deposited on top of etched pads (not shown) of the PCB 109.

One of the main disadvantages of the BGA technology from a manufacturing perspective is that the solder joints are hidden under the package instead of being visible along the device perimeter. Another disadvantage is that individual lead touch-up is not possible; the entire device must be removed and reworked if even a single connection is faulty. In addition, the equipment and overhead required to inspect and rework a faulty BGA component is expensive and time-consuming. The penalty to a manufacturer who creates a faulty BGA solder joint is very high; therefore, it is desirable to create an assembly process that has the best chance of avoiding defects.

The formation of solder paste bricks by solder paste screening is one of the most important steps in BGA assembly, and effective control of the paste deposit is a key to high yield manufacturing of BGAs. BGA components depend on solder paste bricks for providing either flux or a combination of flux and solder for attachment of the component to the PCB. However, a serious problem associated with soldering BGA devices onto a PCB with the use of solder paste bricks, is that volatized flux gases are often trapped within the resulting solder joint, causing voiding in the solder joint.

As part of the reflow cycle, the solder paste bricks go through a soaking temperature zone, in which the flux begins to boil and evaporate, but the solder balls of the BGA device and the solder spheres of the solder paste do not melt. It is during this soaking temperature zone that flux gases can migrate out of the solder joint and thus not cause voids. However, all of the volatized flux gases formed during the soaking temperature phase often do not escape the solder paste brick before the solder balls of the BGA and the solder spheres of the solder paste bricks begin to melt and reflow, at which point the volatized flux gases may become trapped in the melted solder joint formed by the solder balls and the solder paste bricks. As the solder joint cools and hardens, these volatized flux gases become permanent voids within the solder joint which can affect the mechanical properties of the joint and deteriorate the strength and the fatigue life of the joint. Voids can also produce spot overheating, hence reducing the reliability of joints. FIG. 3 is a cross-sectional view of a solder joint 111 formed between BGA device 101 and a pad 107 of a PCB 109. A void 113 caused by entrapped flux gasses, as discussed above, is shown within the solder joint 111.

The emergence of BGA technology has addressed the need for higher circuitry density and has also provided a more efficient way to solder IC's onto a PCB. However, frequent occurrences of large voids in the BGA assembly pose a great concern about the reliability of soldered joints formed under a BGA device. The presence of voids, as discussed above, cause problems in joint reliability and performance.

In view of the foregoing problems associated with BGA devices in SMT applications, what is needed is an improved method and/or apparatus which reduces the amount of voiding in the solder joints formed during the reflow process.

SUMMARY OF THE INVENTION

The present invention addresses the above and other needs by providing an improved solder paste brick design that reduces the distance volatized flux gases must travel to escape from the volume of the solder paste brick. The improved solder paste brick also performs the function of holding a BGA device in place on a PCB such that the solder balls of the BGA device are in proper alignment with designated pads on the PCB during reflow soldering of the BGA device onto the PCB. Therefore, the improved solder paste brick design significantly reduces the number and size of voids which may be formed in a solder joint, while not sacrificing the desirable property of holding BGA parts in proper alignment with the PCB before and during the reflow process. The BGA device is held in place because of the tackiness of the flux associated with the solder paste brick, which "sticks" to the solder balls that touch it.

In one embodiment of the invention, a method of soldering a ball grid array device onto a circuit board includes: positioning a solder paste brick on top of a pad of the circuit board, said solder paste brick defining an irregularly shaped structure so as to facilitate the escape of volatized flux gases from within the solder paste brick during a reflow soldering process; attaching the ball grid array device onto the circuit board such that a solder ball terminal of the ball grid array device makes contact with the solder paste brick and is substantially aligned on top of the pad; and heating the ball grid array device and the circuit board so as to melt the solder ball terminal and the solder paste brick, thereby forming a solder joint between the ball grid array device and the circuit board.

In another embodiment, a method of soldering a ball grid array device onto a circuit board includes: positioning a solder paste brick on top of a contact pad of the circuit board, said solder past brick defining an irregularly shaped structure such that a majority of a top surface of the solder paste brick is not in contact with the solder ball terminal, wherein volatized flux gases formed during heating escape via the top surface without migrating upwardly into the solder ball terminal; attaching the ball grid array device onto the circuit board such that a solder ball terminal of the ball grid array device makes contact with a portion of an edge of the solder paste brick while remaining substantially aligned with a center of the pad; and heating the ball grid array device and the circuit board so as to melt the solder ball terminal and the solder paste brick, thereby forming a solder joint between the ball grid array device and the circuit board.

In a further embodiment, a method of soldering a ball grid array device onto a circuit board includes: positioning a plurality of solder paste bricks on top of a plurality of contact pads of the circuit board, each solder paste brick defining an irregularly shaped structure such that a majority of a top surface of each solder paste brick is not in contact with a respective solder ball terminal so that volatized flux gases formed during heating escape via the top surface of each brick without migrating upwardly into the solder ball terminals during heating, wherein each brick is positioned on top of a respective pad, and wherein each brick is oriented such that it is rotated a specified number of degrees with respect to a brick located on top of an adjacent pad; attaching the ball grid array device onto the circuit board such that each solder ball terminal of the ball grid array device makes contact with a portion of an edge of a respective brick while remaining substantially aligned with a center portion of a respective pad; and heating the ball grid array device and the circuit board so as to melt each solder ball terminal and each solder paste brick, thereby forming solder joints between the ball grid array device and the circuit board.

BRIEF DESCRIPTION OF THE DRAWINGS

FIGS. 6A–6C are top plan views of the solder paste brick designs of FIGS. 4A–4B and 5, showing respective contact areas where a solder ball of a BGA device makes contact with the respective solder paste brick.

FIG. 7 is a top view illustrating one embodiment of an arrangement of solder paste bricks within pads of a PCB in accordance with the invention.

DETAILED DESCRIPTION OF THE PREFERRED EMBODIMENT

The invention is described below with reference to the Figures wherein like numerals refer to like elements throughout.

Figure 1:
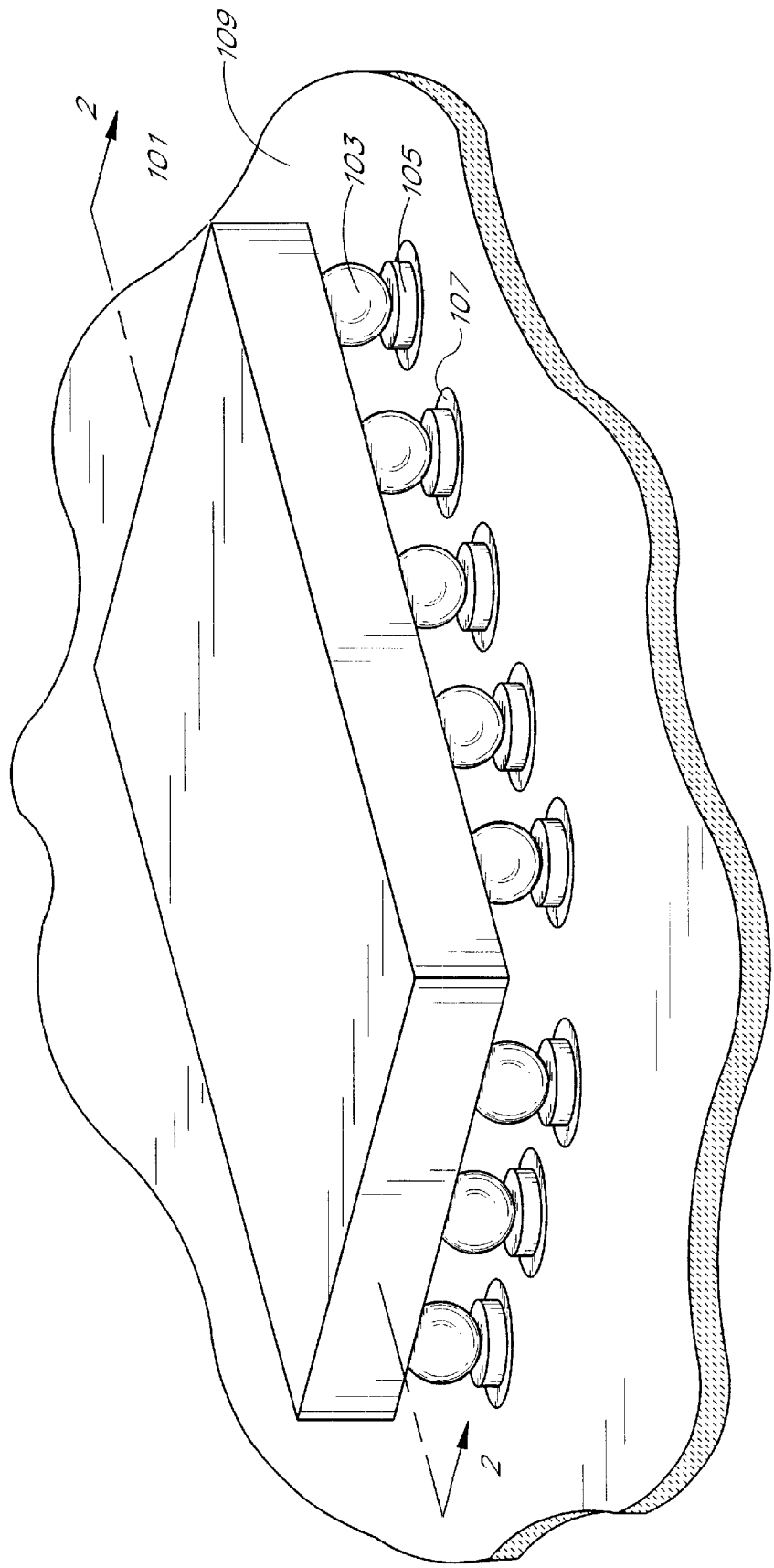
FIG. 1 is a perspective view of a BGA device having solder balls in contact with solder paste bricks which are positioned within pads of a PCB, in accordance with the prior art.
Figure 2:
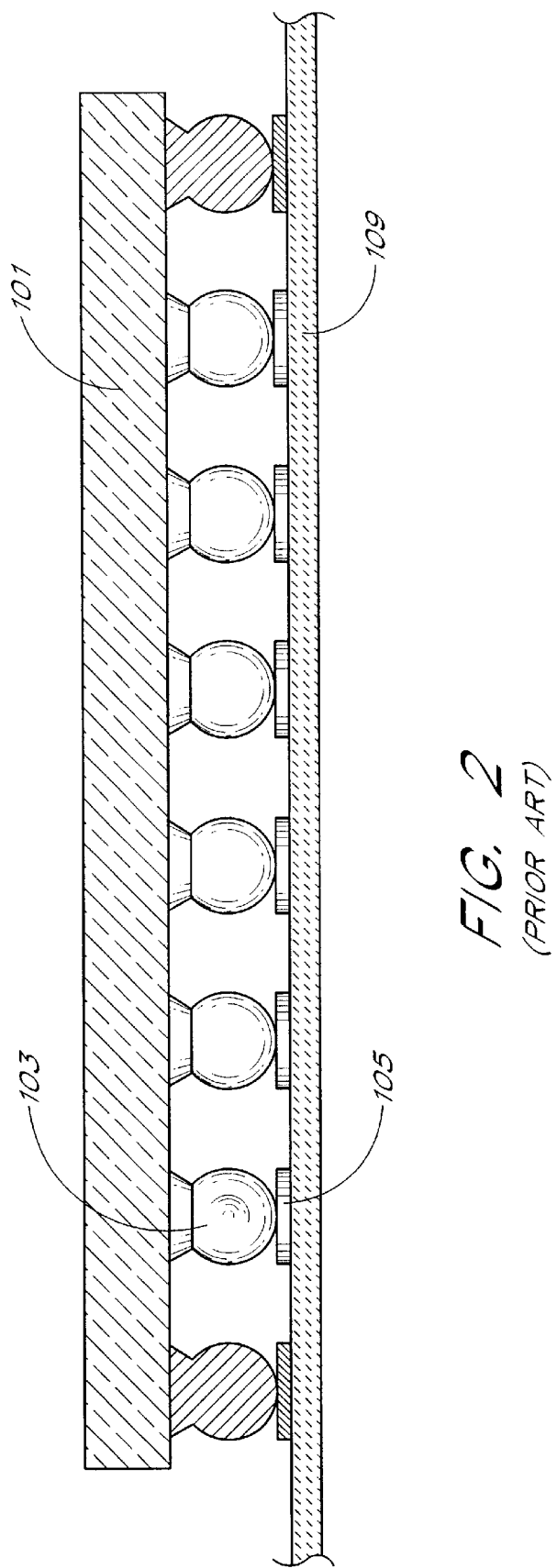
FIG. 2 is a side view of a BGA device, taken along line 2—2 of FIG. 1, the BGA device having solder balls in contact with solder paste bricks positioned within pads of a PCB, in accordance with the prior art.

Referring again to FIG. 1, a typical surface mount of a BGA device 101 onto a PCB 109, is shown. As depicted in FIG. 1, the BGA component 101 has solder ball terminals 103 arranged in an array pattern on a bottom surface of the BGA component 101. The solder ball terminals 103 serve as leads of the BGA component 101 and make contact with solder paste bricks 105 which are positioned atop electrical connection pads 107 of the PCB 109. The BGA IC device 101 is placed on top of the PCB 109 such that the solder ball terminals 103 are aligned with the solder paste bricks 105. During reflow processing, the solder ball terminals 103 and the paste solder elements melt and form electrical contacts between the BGA device 101 and the pads 107 of the PCB 109.

As previously described, the solder paste bricks 105 are typically comprised of a mixture of flux and tiny solder particles, or spheres, which give the bricks 105 a paste-like consistency. In one embodiment, the material for the solder ball terminals, as well as the solder spheres of the solder paste is a metal eutectic which includes the following compositions: 63% Sn/37% Pb, 62% Sn/36% Pb/2% Ag, and 62% Sn/36% Pb/2% In, all with a melting point of roughly 180° C. It should be appreciated, however, that other solder compositions with different melting points may be used in accordance with the present invention.

During the reflow process, the PCB 109, along with the attached BGA component 101, is subjected to an initial "soaking temperature," typically in the range of 130°–150° C., for a period of approximately 40–90 seconds. After the PCB/BGA device assembly has undergone the soaking temperature phase of the process, the assembly enters into the reflow phase in which it is heated to a temperature range of 180°–200° C. During this phase, the solder ball terminals 103 as well as the tiny solder spheres of the solder paste bricks will begin to melt and liquify.

It is during the soaking temperature phase that the flux within the solder paste bricks begins to boil and evaporate forming volatile flux gases. These flux gases can migrate out of the solder paste brick 105 during the soaking temperature phase. However, often with the use of prior art solder paste brick designs, all of the volatized flux gases do not escape from the solder paste brick 105 before the PCB/BGA assembly enters the reflow phase and the solder spheres of the brick 105 and the solder ball terminals 103 begin to melt to form solder joints. These flux gases may become trapped within the solder joints formed as the solder ball terminals 103 and the tiny solder spheres of each brick 105 begin to melt and reflow together.

Figure 3:
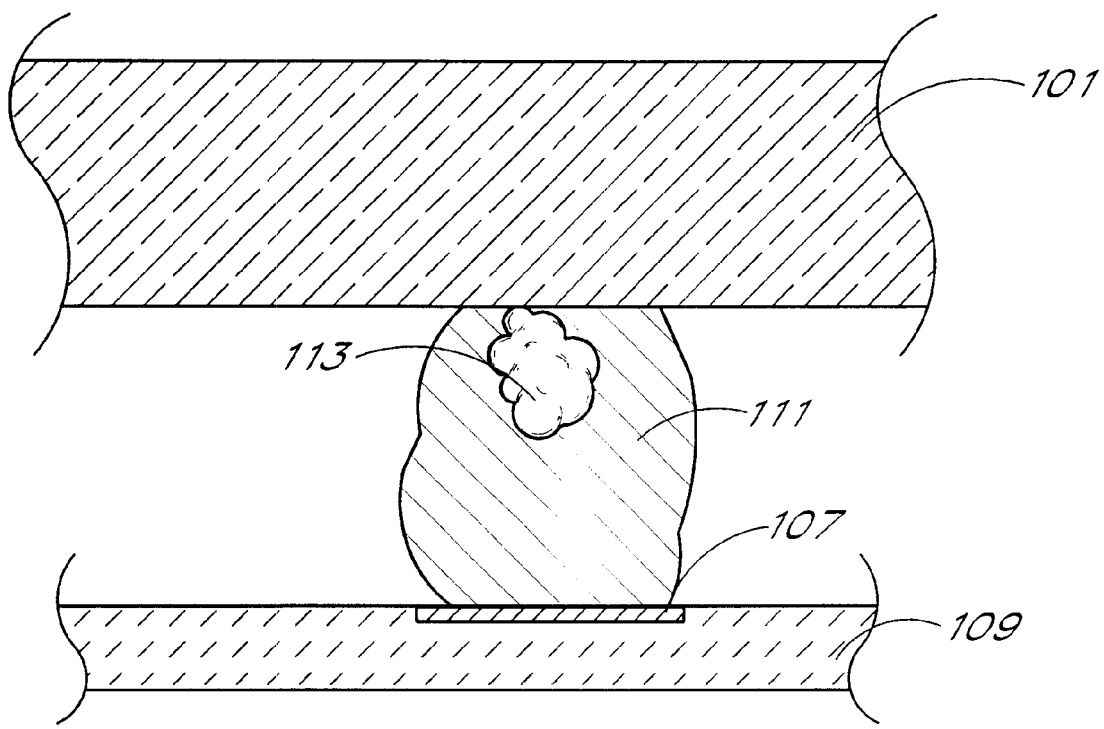
FIG. 3 is a magnified side view of a solder joint, having a void therein, formed by a reflow process in accordance with prior art use of solder paste bricks.

FIG. 3 illustrates a solder joint 111 which contains a void 113 caused by volatized flux gases trapped within the solder joint 111. Because the flux gases tend to migrate upwardly, any flux gases trapped within the solder joint 111 tend to migrate upwardly toward the bottom surface of the BGA component 101, thereby becoming trapped and forming a void at the contact point of the solder joint 111 and the BGA component body 101. As discussed above, such voids cause problems in the reliability, functionality and structural durability of the BGA component 101.

Figure 4B:
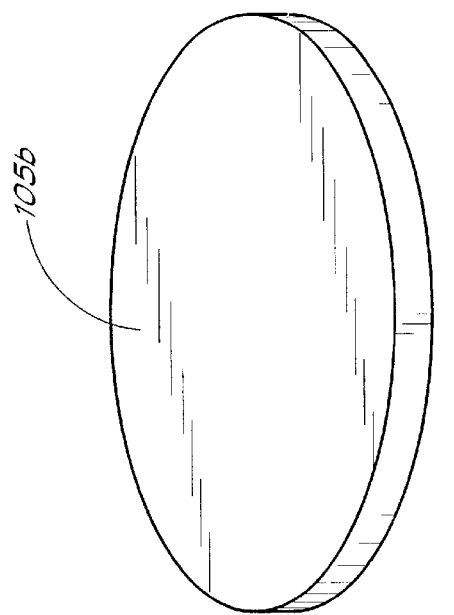
FIG. 4B is a perspective view of another embodiment of a prior art solder paste brick design.
Figure 4A:
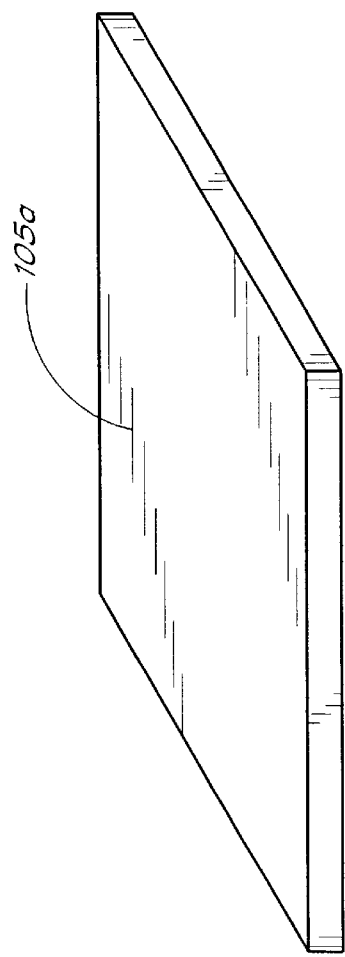
FIG. 4A is a perspective view of one embodiment of a prior art solder paste brick design.

FIGS. 4A and 4B illustrate two typical prior art designs for solder paste bricks 105a and 105b. The shape of the solder paste brick 105a is that of a square or a rectangle while that of the solder paste brick 105b is a circular disk. As will be explained in further detail below, these prior art solder paste bricks shapes are not conducive to reducing voiding in the solder joints formed during the reflow soldering process.

Figure 5:
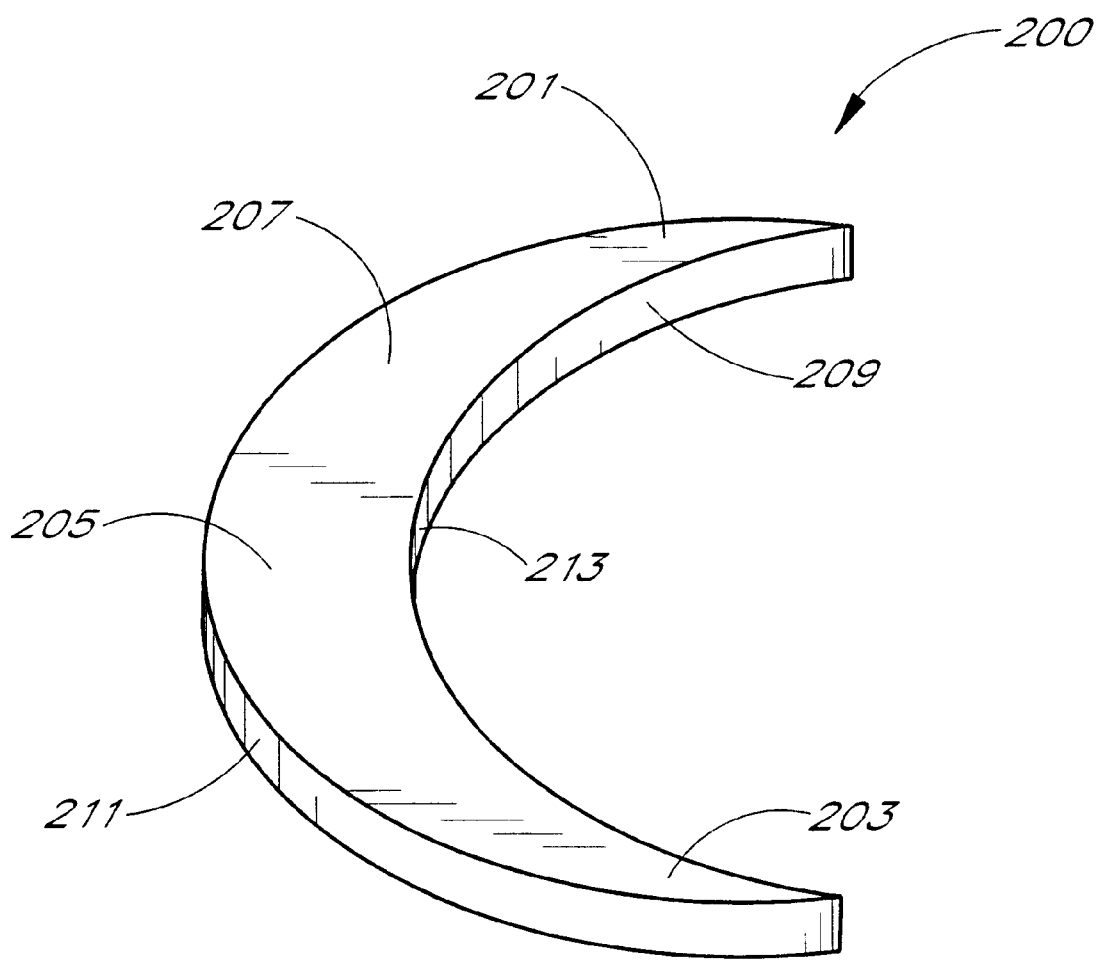
FIG. 5 is a perspective view of one embodiment of a solder paste brick design in accordance with the present invention.

FIG. 5 illustrates one embodiment of an improved solder paste brick design in accordance with the invention. This solder paste brick 200 is in the shape of a crescent, similar to that of a quarter moon. This shape is advantageous in that it allows a sufficiently large volume of solder paste to be positioned within a pad of a PCB so as to hold, or attach, a BGA component to the PCB before and during the reflow solder process, while providing a contact point along a portion of an inside edge 213 for making contact with a solder ball terminal of the BGA component. As will be described in further detail below, by providing a contact point along a portion of the inside edge 213 of the solder paste brick 200, the invention facilitates the escape of volatized flux gases from within the solder paste brick 200 during a reflow soldering process. The improved solder paste brick 200 has a first tapered end 201 and a second tapered end 203 with a middle portion 205 which is integral to the first and second tapered ends, 201 and 203, and which is positioned therebetween. The solder paste brick 200 also includes a top surface 207 and a bottom surface (not shown) and first and second side surfaces 209 and 211, respectively. The solder paste brick 200 also includes an edge 213 formed between the top surface 207 and the first side surface 209.

It is advantageous that the solder ball contacts the solder paste brick 200 along the edge portion 213 rather than having such contact occur across the top surface, because during the soaking temperature phase and the beginning of the reflow phase discussed above, volatized flux gases escape from the top surface 207 as well as the side surfaces 209 and 211 of the brick 200. As can be appreciated, if a solder ball terminal is directly on top of the top surface 207 of the solder paste brick 200, as volatized flux gases migrate upwardly, there is a substantial probability that these flux gases will migrate up into the solder ball terminal itself as it begins to melt during the reflow phase of the process. This can cause substantial voiding at the base of the solder joint where it meets the BGA component. Therefore, by placing the solder ball terminal at a position where it only touches the edge 213 of the solder paste brick 200, such upwardly migrating flux gases have a significantly better chance to escape from the volume of the solder paste brick 200 without migrating into the solder ball terminal as it begins to melt.

Referring to FIGS. 6A–6C, one can see the advantages of the crescent shape solder brick 200 over the prior art solder bricks 105a and 105b of FIG. 4. In particular, it is noted that the shaded regions 115a, 115b and 215 represent contact points between the respective solder paste bricks 105a, 105b or 200 and a solder ball terminal (not shown) of a BGA device. As can be seen from the various shaded regions on each of the solder paste bricks, the crescent shape of solder brick 200 affords a minimum contact area with the solder ball terminal, at the edge 213 of the solder paste brick 200, thereby minimizing the area in which volatized flux gases may migrate upwardly into the solder ball terminal as it melts to form a solder joint. Additionally, the crescent shape of the solder paste brick 200 provides an adequate volume of solder paste onto the PCB pad 217 in order to hold the BGA device on the PCB while minimizing the contact surface area between the solder ball terminal and the brick 200.

It can be seen from FIGS. 6A–6C that in order to minimize the contact surface area between a solder ball terminal and the prior art solder paste bricks 105*a* and 105*b*, a solder ball terminal would have to be moved a distance A or B, respectively, in order to make contact with an edge of the solder paste brick 105*a* or 105*b*. The distances A and B may be as long as 15–20 mils. Such a shift in the position of the solder ball terminals would cause misalignment problems between the pads 107*a*, 107*b* and the solder ball terminals. However, with the use of the crescent-shaped solder paste brick 200 of the present invention, one can see that there is no need to shift the position of a BGA device so as to have a solder ball terminal of the BGA device make contact with only an edge portion 213 of the solder paste brick 200.

FIG. 7 illustrates one embodiment of a method of arranging multiple solder paste bricks 200 onto the pads 217 of a PCB in order to hold the solder ball terminals (not shown) of a BGA component in proper alignment with the pads 217. The crescent shaped bricks 200 are arranged such that each brick 200 within an adjacent row or column of pads, is rotated 90 degrees with respect to one another. It is appreciated that by arranging the bricks 200 in this fashion, the solder paste bricks 200 hold a BGA component in alignment with the pads 217 of the PCB such that the BGA component is secured against moving, or sliding, in each of the directions designated as "N," "S," "E," or "W" in FIG. 7. However, it is understood that adjacent bricks need not be rotated exactly 90 degrees with respect to one another. Other angles of rotation are contemplated by the invention. Depending on the size and shape of the bricks 200, adjacent bricks may be rotated 180 degrees, for example, with respect to one another.

Figure 8C:
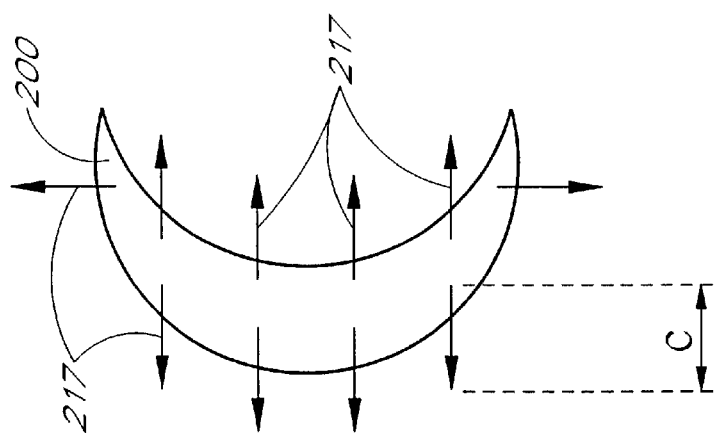
FIGS. 8A–8C are top views of various solder paste brick shapes illustrating the relative distances, represented by arrows, that flux gases must travel in order to escape the volume of different types of solder paste bricks.
Figure 8B:
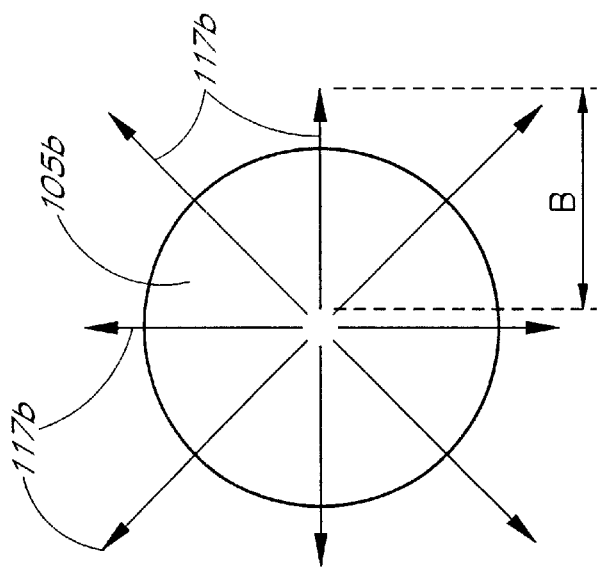
Figure 8A:
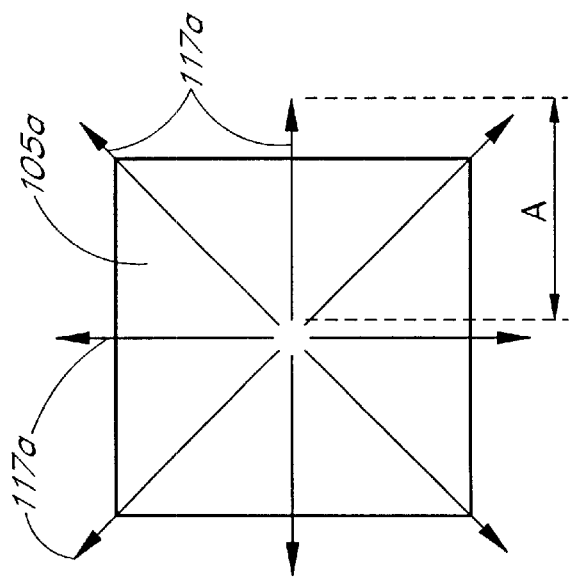

FIGS. 8A–8C are top views of different solder paste brick shapes which illustrate further advantages of the shape of the solder paste brick 200 when compared to that of the solder paste bricks 105*a* and 105*b*. The arrows 117*a*, 117*b* and 217 represent the relative distances that volatized flux gases must travel as they pass in the indicated directions within the bricks in order to escape the side surfaces of the solder paste bricks 105*a*, 105*b* and 217, respectively. An average distance that flux gases must travel to escape a side surface of the brick 105*a* can be represented by the distance A. Similarly, B and C represents the average distances flux gases must travel to escape a side surface of the bricks 105*b* and 200, respectively. As can be seen from FIGS. 8A–8C, assuming the size of each of the solder paste brick designs are accurately scaled with respect to each other, the average distance C that flux gases must travel in order to escape from side surfaces of the solder paste brick 200 is much shorter than the average distances A and B that flux gases must travel in order to escape from side surfaces of the solder paste bricks 105A and 105B, respectively. Consequently, volatized flux gases which are formed during the soaking temperature phase and migrate out of the solder joint area during both the soaking temperature phase and the reflow phase, have a much shorter distance to travel when using the solder paste brick 200 compared to the prior art solder bricks 105*a* and 105*b*. A shorter distance correlates to a shorter time required for the volatized flux gases to migrate outwardly and therefore allows more of the flux gases to escape during the soaking temperature phase discussed above. Therefore, the improved solder paste brick 200 shown in FIG. 8C, not only promotes the escape of volatized flux gases via the top surface of the solder paste brick 200, as discussed above with reference to FIGS. 5 and 6A–6C, but also improves the rate at which volatized flux gases may escape via the side surfaces of the solder paste brick 200, as shown in FIGS. 8A–8C.

Figure 9B:
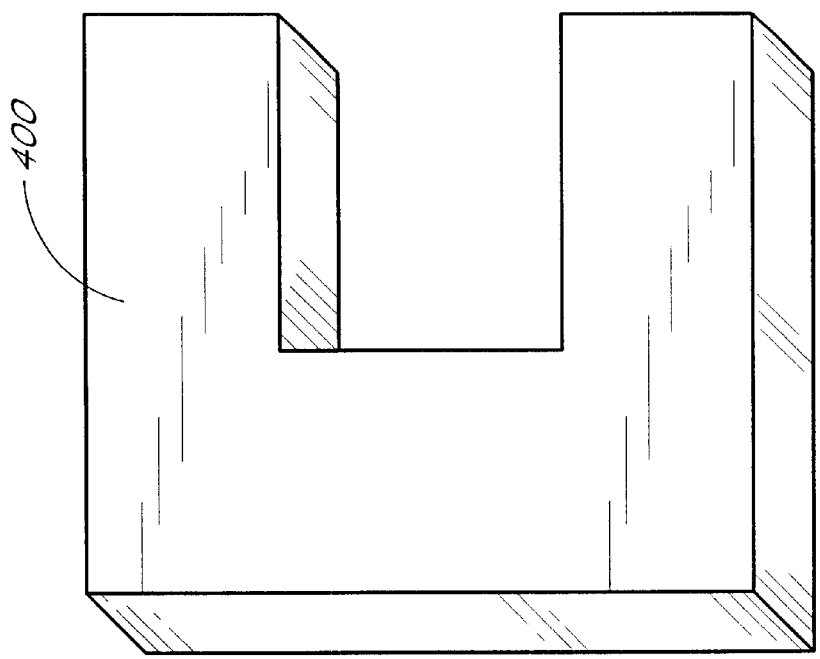
FIG. 9B is a perspective view of another embodiment of a solder paste brick design in accordance with the invention.
Figure 9A:
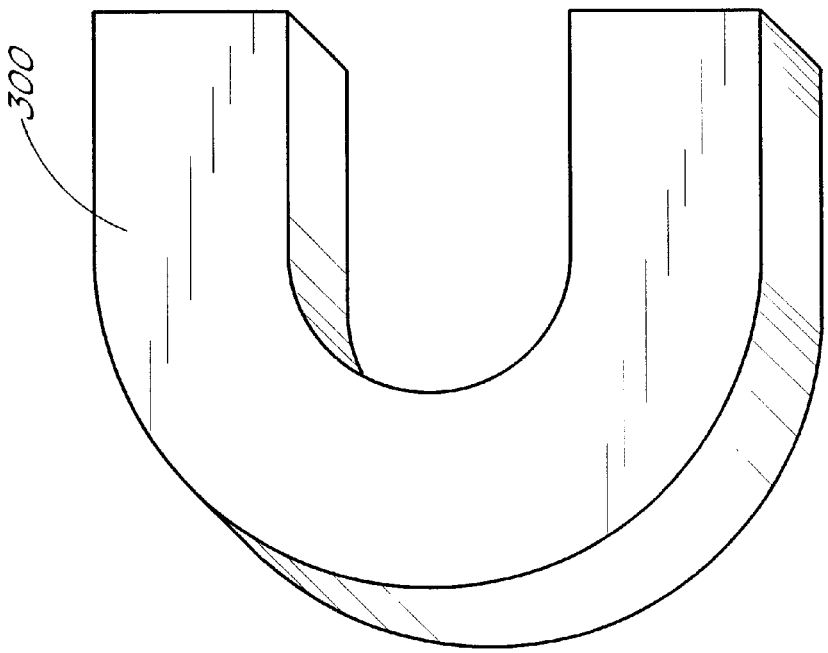
FIG. 9A is a perspective view of another embodiment of a solder paste brick design in accordance with the invention.

FIGS. 9A and 9B show alternate embodiments of the invention. FIG. 9A shows a solder paste brick 300 which is in the shape of a "C". FIG. 9B shows a solder paste brick 400 which is in the shape of a square or block "C". The configurations illustrated in FIGS. 9A and 9B offer advantages over the prior art in that they provide for increased escape of volatized flux gases that may escape via the top and side surfaces of the respective solder paste bricks. These irregularly shaped structures are just one of many such structures that can provide the advantage of the invention. As used herein, the term "irregularly shaped structure" refers to any structure that is not circular, square or oblong and which allows a solder ball terminal of a BGA device to make contact with an edge portion of a corresponding solder paste brick having such an irregularly shaped structure, while further allowing proper alignment between the solder ball terminals of the BGA device and the pads of a printed circuit board. One can readily envision modifications of these shapes as well as other shapes for providing the advantages and functionality described herein.

The invention as described above provides an improved solder paste brick which significantly reduces the amount of voiding in solder joints formed between BGA devices and the etched pads of a PCB. By reducing the surface area in which a ball terminal of the BGA device makes contact with a top surface of the solder paste brick, the probability that volatized flux gases will migrate upwardly into the solder ball terminal as it begins to melt is significantly reduced. Furthermore, the shape of the improved solder paste brick reduces the distance that flux gases must travel in order to escape from the side surfaces of the brick, thereby allowing a greater volume of flux gases to escape, consequently reducing the amount of flux gases which may become trapped within the solder joint. The shape of the improved solder paste brick also allows an adequate amount of solder paste to be deposited on each pad in order to hold a BGA device in position atop a PCB before and during reflow processing. Finally, the shape of the improved solder paste brick is configured such that the solder ball terminals may make contact with only an edge of the brick and remain in proper alignment with their corresponding pads.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of soldering a ball grid array device onto a circuit board, comprising:

positioning a solder paste brick on top of a pad of the circuit board, said solder paste brick comprising a body having a top surface, a bottom surface, an exterior sidewall, and an interior sidewall with a gap separating a first end of the interior sidewall from a second end of the interior sidewall to define a non-contiguous contact edge for contacting a portion of a solder ball of the ball grid array;

attaching the ball grid array device onto the circuit board such that a solder ball terminal of the ball grid array device makes contact with a portion of the solder paste brick and is substantially aligned on top of the pad; and heating the ball grid array device and the circuit board so as to melt the solder ball terminal and the solder paste brick, thereby forming a solder joint between the ball grid array device and the circuit board.

2. The method of claim 1 wherein the solder paste brick is configured such that a portion thereof makes contact with a solder ball terminal so as to retain the solder ball terminal substantially adjacent to a center portion of the pad while preventing contact between a majority of a top surface of the solder paste brick and the solder ball terminal during a reflow soldering process, thereby allowing volatized flux gases formed during the reflow soldering process to escape via the top surface without migrating upwardly into the solder ball terminal during the reflow soldering process.

3. The method of claim 1 wherein the solder paste brick is configured in the shape of a crescent.

4. The method of claim 1 wherein the solder paste brick is made from eutectic solder paste.

5. A method of soldering a ball grid array device onto a circuit board, comprising:

positioning a solder paste brick on top of a contact pad of the circuit board, said solder paste brick having a top surface, a bottom surface, an exterior sidewall, and an interior sidewall with a gap separating a first end of the interior sidewall from a second end of the interior sidewall to define an irregularly shaped structure such that a majority of a top surface of the solder paste brick is not in contact with the solder ball terminal, wherein volatized flux gases formed during heating escape via the top surface without migrating upwardly into the solder ball terminal;

attaching the ball grid array device onto the circuit board such that a solder ball terminal of the ball grid array device makes contact with a portion of an edge of the solder paste brick while remaining substantially aligned with a center of the pad; and heating the ball grid array device and the circuit board so as to melt the solder ball terminal and the solder paste brick, thereby forming a solder joint between the ball grid array device and the circuit board.

6. The method of claim 5 wherein the solder paste brick is configured in the shape of a crescent.

7. The method of claim 5 wherein the solder paste brick is made from eutectic solder paste.

* * * * *